United States Patent
Wang et al.

(10) Patent No.: US 6,562,683 B1
(45) Date of Patent: May 13, 2003

(54) BIT-LINE OXIDATION BY REMOVING ONO OXIDE PRIOR TO BIT-LINE IMPLANT

(75) Inventors: Fei Wang, San Jose, CA (US); David K. Foote, San Jose, CA (US); Stephen K. Park, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 29 days.

(21) Appl. No.: 09/651,704

(22) Filed: Aug. 31, 2000

(51) Int. Cl.⁷ .............................................. H01L 21/336
(52) U.S. Cl. ........................ 438/258; 438/261; 438/287
(58) Field of Search ................................ 438/258, 261, 438/279, 287

(56) References Cited

U.S. PATENT DOCUMENTS

| | | | | |
|---|---|---|---|---|
| 6,133,095 A | * | 10/2000 | Eitan et al. | 438/261 |
| 6,346,442 B1 | * | 2/2002 | Aloni et al. | 438/216 |

* cited by examiner

*Primary Examiner*—Olik Chaudhuri
*Assistant Examiner*—William M. Brewster

(57) ABSTRACT

A method for fabricating a semiconductor structure includes forming a masking pattern on an ONO layer, wherein the ONO layer is on a semiconductor substrate, forming pocket regions in the substrate with the masking pattern as a doping mask, etching the ONO layer with the masking pattern as an etching mask forming residual oxide regions, etching the ONO layer with a buffered oxide etch or a plasma etch exposing regions of the substrate, and removing the mask and forming a bit-line oxide layer on the exposed regions.

16 Claims, 6 Drawing Sheets

BIT-LINE OXIDATION BY REMOVING ONO OXIDE PRIOR TO BIT-LINE IMPLANT

FIELD OF THE INVENTION

This invention relates to a process for fabricating semiconductor devices containing ONO layers.

BACKGROUND

Non-volatile memory devices are currently in widespread use in electronic components that require the retention of information when electrical power is terminated. Non-volatile memory designers have taken advantage of the ability of silicon nitride to store charge in localized regions and have designed memory circuits that utilize two regions of stored charge within an ONO (silicon oxide/silicon nitride/silicon oxide) layer. This type of non-volatile memory device is known as a two-bit EEPROM. Although an ONO layer has particular advantages in a non-volatile memory device, it may be useful in many other semiconductor devices.

While the recent advances in ONO technology have enabled memory designers to double the memory capacity of EEPROM arrays using two-bit data storage, numerous challenges exist in the fabrication of material layers within these devices. In particular, fabricating a bit-line oxide layer of consistent thickness between and across memory chips presents several challenges. Typically, in the fabrication of a memory cell, an ONO layer formed having a first silicon dioxide layer overlying the semiconductor substrate, a silicon nitride layer overlying the first silicon dioxide layer; and a second silicon dioxide layer overlying the silicon nitride layer. A layer of photoresist is then spun on to the ONO layer. A photoresist is a light sensitive film that has four basic ingredients: polymers, solvents, sensitizers, and additives. The photoresist is patterned and the semiconductor substrate is doped through the opening in the pattern. The ONO layer is then patterned by etching, using the same pattern. Next, the photoresist mask is stripped and cleaned from the ONO layer and a bit-line oxide region is thermally grown onto the semiconductor substrate in the region where the ONO layer was etched.

There are several problems that occur with the above-described conventional method for fabricating a memory cell. One problem is that the ONO etch does not have good selectivity for silicon dioxide and can damage the semiconductor substrate. A second problem is that the ONO etch occurs at a rapid rate and it is difficult to estimate when the etching process should be terminated. If the ONO etch is carried out slightly longer than necessary, the semiconductor substrate could be damaged. The low selectivity to oxide and the rapid rate of the ONO etch process necessitates early termination of the ONO etching process. As a result, a layer of residual oxide overlying the semiconductor substrate remains after the ONO etch. The residual oxide layer has an inconsistent thickness. Thus the thickness of the resulting bit-line oxide region is also not consistent, due to the residual oxide layer. This inconsistent oxide region may result in inconsistent device properties.

BRIEF SUMMARY

In one aspect, the invention is a method of fabricating a semiconductor structure which includes etching regions of residual oxide on a first structure, to form bit-line regions. The semiconductor structure includes a semiconducting substrate, a patterned ONO layer on said substrate, wherein said patterned ONO layer comprises regions of ONO and said regions of residual oxide, and a patterned photoresist layer on said regions of ONO.

In another aspect, the invention is a method for fabricating a semiconductor structure which includes forming a masking pattern on an ONO layer, wherein the ONO layer is on a semiconductor substrate, forming pocket regions in the substrate with the masking pattern as a doping mask, etching the ONO layer with the masking pattern as an etching mask forming residual oxide regions, etching the ONO layer with a buffered oxide etch or a plasma etch exposing regions of the substrate, and removing the mask and forming a bit-line oxide layer on the exposed regions.

In yet another aspect, the invention is a semiconductor device which includes a semiconductor substrate, at least one patterned ONO layer on said substrate, and at least one bit-line oxide layer on said substrate. At least 99 percent of the bit-line oxide layer has a thickness that is at least 80 percent of the thickness of the thickest part of the bit-line oxide layer.

In still another aspect, the invention is a set of semiconductor devices that include a plurality of semiconductor substrates, a plurality of patterned ONO layers, on said substrates, and a plurality of bit-line oxide layers on said substrates. At least 99 percent of the bit-line oxide layers have a thickness that is at least 80 percent of the thickness of the thickest bit-line oxide layer.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION

The present invention includes a process for fabricating a semiconductor device. The individual processing steps for use in the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley, 1996; and Microchip Fabrication 3rd. edition, Peter Van Zant, McGraw-Hill, 1997.

In one aspect, a process for fabricating a semiconductor device includes providing a semiconductor substrate and forming an ONO layer over the semiconductor substrate. The semiconductor substrate is the underlying material upon which a device, circuit, or epitaxial layer is fabricated. The semiconductor substrate is then doped with dopants. After doping the semiconductor substrate, the ONO layer is removed with an ONO etch. After the ONO etch, a residual layer of oxide remains over the semiconductor substrate. This residual layer of oxide is then etched using a buffered oxide etch or a plasma etch. The buffered oxide etch and the plasma etch are slower and have greater selectivity to oxide compared to the ONO etch process. Since the etching has a greater selectivity to oxide and occurs at a slower rate in a buffered oxide etch and a plasma etch, it is easier to remove the residual oxide layer without damaging the semiconductor substrate. A bit-line oxide layer is then grown on the semiconductor substrate. Compared to other processes, the resulting bit-line oxide layer is much closer to the desired thickness and is consistent between and across the semiconductor device. The thickness of the bit-line oxide layer between and across the semiconductor device is such that at least 99 percent of the bit-line oxide layers have a thickness that is at least 80 percent of the thickest bit-line oxide layer. Adding a buffered oxide etch or a plasma etch after the ONO etch, allows for the fabrication of a memory cell with tighter critical dimensions and improved functionality.

Figure 1:
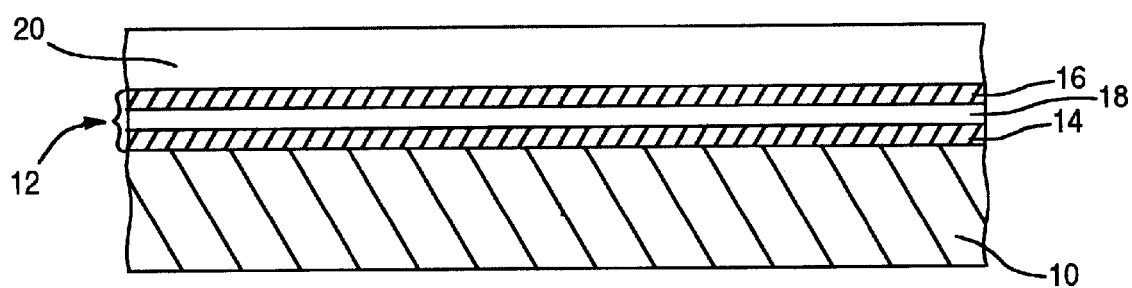
FIG. 1 illustrates, in cross section, a portion of a memory cell.

FIG. 1 shows a cross-section of a portion of a semiconductor structure substrate 10. An ONO layer 12 is on the semiconductor substrate 10 and includes a first oxide layer 14, a second oxide layer 16 and a silicon nitride layer 18 between the first oxide layer and second oxide layer. A photo resist layer 20 is on the ONO layer. The photo resist layer may be any type of resist, including optical photoresist responsive to physical and near UV light, deep UV resist, etc. Alternatively, the photo resist layer may be an inorganic resist layer or an X-ray resist layer.

Figure 2:
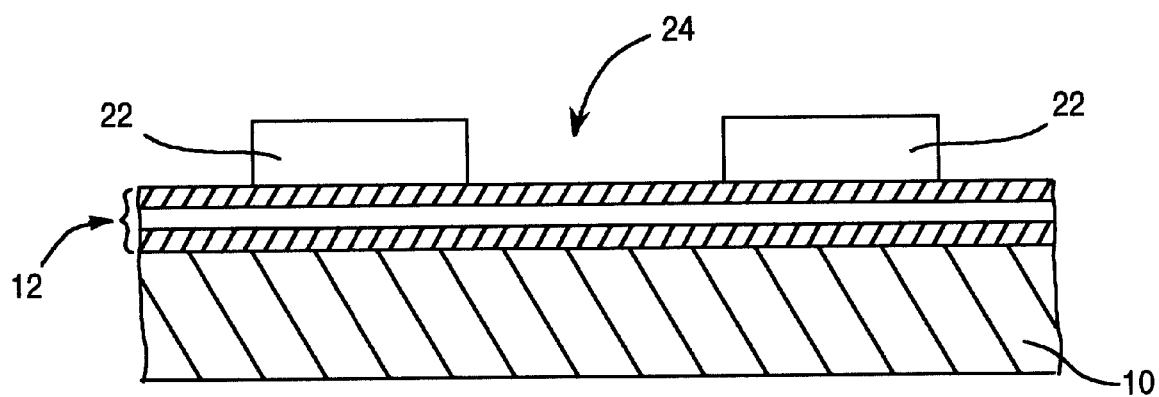
FIG. 2 illustrates, in cross section, a portion of a memory cell with a patterned layer.

Photo resist layer 20 is next exposed to radiation of the appropriate wavelength and developed to form a resist pattern 22 on the ONO layer 12, as illustrated in FIG. 2. The resist pattern exposes selected regions 24 of ONO layer 12.

Figure 3:
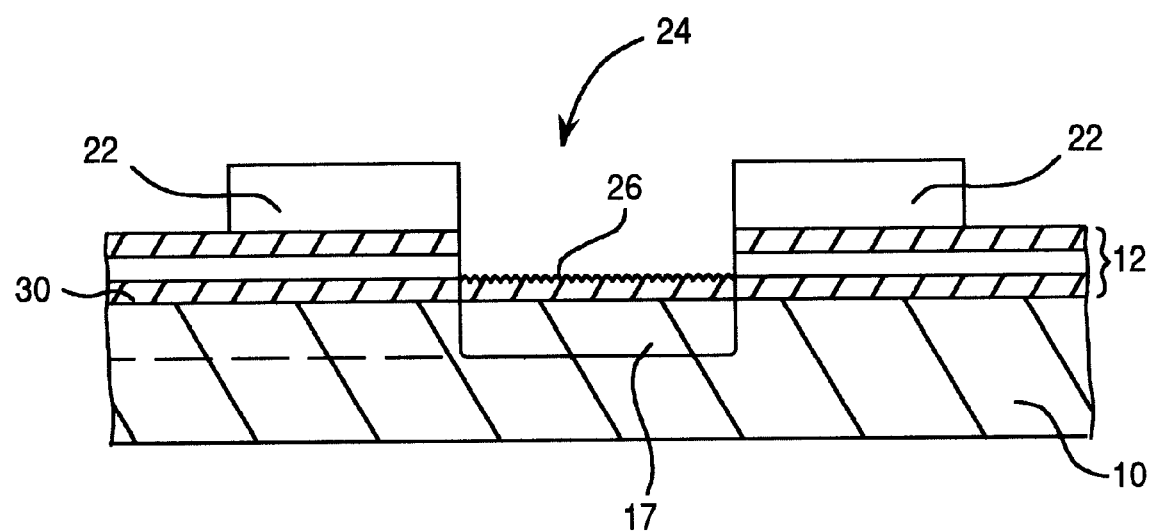
FIG. 3 illustrates, in cross section, a portion of a memory cell after a doping process.

Referring to FIG. 3, portions of the ONO layer exposed through the resist pattern are etched. In a preferred embodiment, the ONO layer is anisotropically etched, so that the ONO layer and the resist pattern have continuous, substantially vertical, sidewalls. Once the ONO etching process is complete, a residual layer of oxide 26 remains on portions of the semiconductor substrate 10, where the ONO layer was etched.

Figure 4:
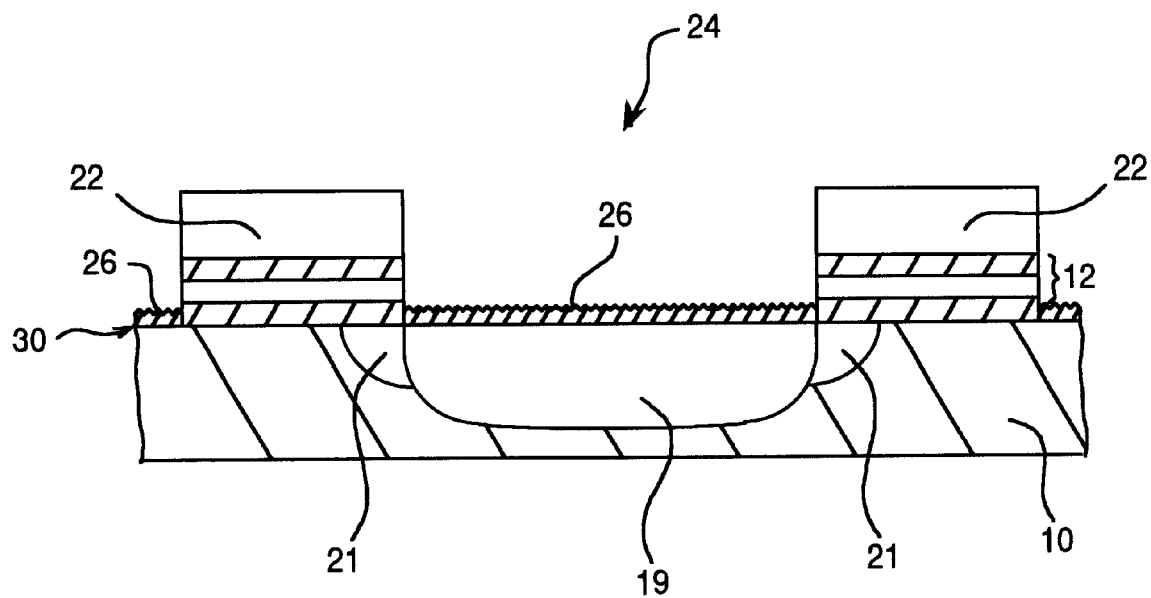
FIG. 4 illustrates, in cross section, a portion of a memory cell after an ONO etch process.

A doping process is carried out over exposed selected regions 24 to form doped regions 17, as illustrated in FIG. 3. Furthermore, in a preferred embodiment an n-type region 19 and p-type pocket regions 21 are formed, as shown in FIG. 4. The doping process may be carried out before or after the ONO etch. Preferably, the p-type pocket regions are formed before the ONO etch and the n-type region is preferably formed after the ONO etch.

P-type pocket regions 21 are formed by doping semiconductor substrate 10 with a p-type dopant. Preferably, semiconductor substrate 10 is doped with a p-type dopant by ion implantation of boron. The ion implantation is preferably an angled implant, that is, an implant at an angle acute with respect to the principal surface 30 of semiconductor substrate 10. The angled implant process can be carried out at an angle of incidence of about 20 degrees to about 45 degrees depending upon the thickness and spacing of photo resist layer 20.

N-type region 19 is formed by ion implantation of an n-type dopant, such as arsenic, antimony, phosphorus, and the like. Alternatively, the semiconductor substrate 10 can be doped using molecular beam ion implantation or plasma assisted ion implantation. The ion implantation is preferably a direct ion implant performed at an angle substantially normal to principal surface 30 of semiconductor substrate 10.

Figure 5:
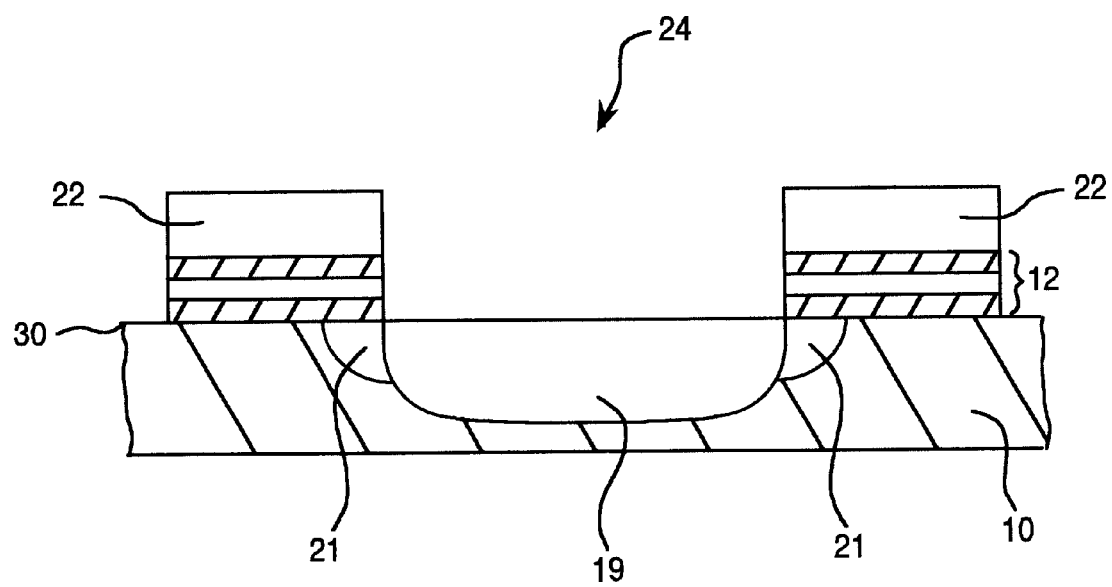
FIG. 5 illustrates, in cross section, a portion of a memory cell after buffered oxide etch or a plasma etch.

After the doping process, the residual oxide layer 26 is etched using either a buffered oxide etch or a plasma etch, resulting in the structure shown in FIG. 5. Preferably, a buffered oxide etch is performed using a solution of HF and ammonium fluoride to allow oxide etching of the residual oxide layer at a slow, controlled rate. Alternatively, a plasma etch may be performed to remove the residual oxide layer, preferably using a dry etch process of reactive gases energized by a plasma field. The residual oxide layer is substantially removed, and although small amounts of residual oxide may remain, they are so thin that they do not interfere with any subsequent oxidation.

Figure 6:
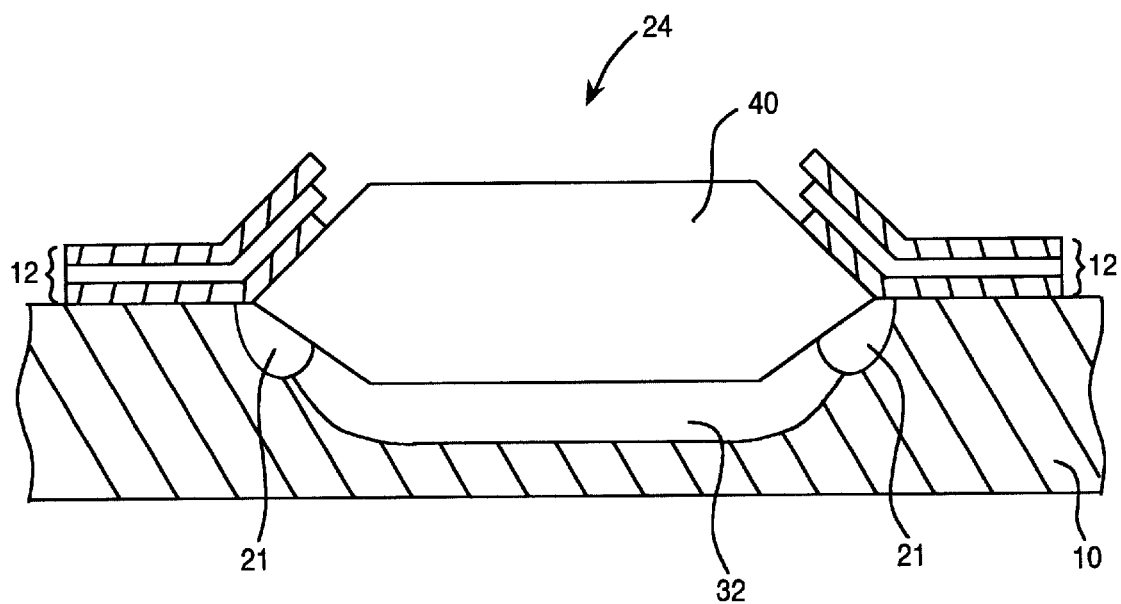
FIG. 6 illustrates, in cross section, a portion of a memory cell after formation of a bit-line oxide region.

Once the residual oxide layer is etched, the resist pattern 22 is removed and a bit-line oxide layer 40 is formed. In a preferred embodiment, the bit-line oxide layer is formed by thermal oxidation of semiconductor substrate 10 using ONO layer 12 as an oxidation mask. The ONO layer, having been previously patterned, exposes selected regions 24 of semiconductor substrate 10. During the preferred oxidation process, the patterned portions of the ONO layer prevent the oxidation of the semiconductor substrate in the region underlying the ONO layer. Accordingly, the bit-line oxide layer is confined to the selected regions of the semiconductor substrate. Upon completion of the oxidation process, the bit-line oxide layer is on bit-line region 32 in the semiconductor substrate, as illustrated in FIG. 6. As used herein, the term "regions" maybe one continuous region across the semiconductor substrate or multiple regions.

The resulting bit-line oxide layer 40 is of a consistent thickness and allows for a uniform amount of electrical charge to be carried between and across the semiconductor device. Since differences in the amount of charge carried by different cells affect the long-term functionality of a memory device, removing the ONO layer 12 completely results in a semiconductor device with good critical dimensions control and long-term functionality.

The structure of the present invention may be incorporated into a semiconductor device such as an integrated circuit, for example a memory cell such as an SRAM, a DRAM, an EPROM, an EEPROM etc.; a programmable logic device; a data communications device; a clock generation device; electronic appliances using semiconductors, automobiles, computers, and the like.

Obviously, numerous modifications and variations of the present invention are possible in light of the above teachings. For example, although the process described above is directed toward a memory cell, the doping of the semiconductor substrate may be carried out before or after the plasma etch or the buffered oxide etch. It is therefore to be understood that within the scope of the appended claims, the invention may be practiced otherwise than as specifically described herein.

What is claimed is:

1. A method of fabricating a semiconductor structure, comprising:

etching regions of an ONO layer with a first etch process to produce regions of residual oxide, and subsequently etching said residual oxide using a slower second etch process having greater oxide selectivity, on a first structure, to substantially remove said residual oxide, thereby forming exposed bit-line regions;

wherein said semiconductor structure comprises:
(i) a semiconducting substrate,
(ii) a patterned ONO layer on said substrate, wherein said patterned ONO layer comprises regions of ONO and said regions of residual oxide, and
(iii) a patterned photoresist layer on said regions of ONO.

2. The method of claim 1, wherein said bit-line region is formed in a portion of the substrate exposed by said etching.

3. The method of claim 1, wherein said etching of said region of residual oxide is by:
(i) a buffered oxide etch, or
(ii) a plasma etch.

4. The method of claim 3, wherein said process further comprises, prior to said etching of regions of residual oxide:
etching an ONO layer, to form said patterned ONO layer.

5. The method of claim 3, wherein said process further comprises, after said etching of regions of residual oxide:
forming a bit-line oxide layer on said bit-line regions.

6. The method of claim 4, wherein said process of forming a bit-line oxide layer comprises thermal oxidation of the semiconductor substrate.

7. A method for fabricating a semiconductor structure comprising:
(i) forming a masking pattern on an ONO layer, wherein the ONO layer is on a semiconductor substrate;
(ii) forming pocket regions in the substrate with the masking pattern as a doping mask;
(iii) etching the ONO layer with the masking pattern as an etching mask forming residual oxide regions, using a first etch process;
(iv) etching said residual oxide regions with a slower second etch process having a greater oxide selectivity, thereby exposing regions of the substrate; and
(v) removing the mask and forming a bit-line oxide layer on the exposed regions.

8. The method of claim 7, wherein the method of forming a bit-line region comprises implanting a dopant of a first conductivity type to a first junction depth.

9. The method of claim 7, wherein the method of forming pocket regions comprises implanting a dopant of a second conductivity type to a second junction depth, wherein the first junction depth is greater than the second junction depth.

10. The method of claim 7, wherein forming a bit-line oxide region comprises thermal oxidation of the semiconductor substrate.

11. The method of claim 7, wherein the semiconductor structure is a non-volatile flash memory structure.

12. A method of making a semiconductor device, comprising:
making a semiconductor structure by the method of claim 1; and
forming a semiconductor device from said semiconductor structure.

13. A method of making an electronic device, comprising:
making a semiconductor device by the method of claim 12; and
forming an electronic device comprising said semiconductor device.

14. A method of making a semiconductor device, comprising:
making a semiconductor structure by the method of claim 7; and
forming a semiconductor device from said semiconductor structure.

15. A method of making an electronic device, comprising:
making a semiconductor device by the method of claim 14; and
forming an electronic device comprising said semiconductor device.

16. A method of making an electronic device, comprising:
forming an electronic device comprising the semiconductor device of claim 12.

* * * * *